(12) United States Patent
Kunii (10) Patent No.: US 8,384,394 B2
(45) Date of Patent: Feb. 26, 2013

(54) COMMUNICATION APPARATUS AND WITHSTAND VOLTAGE TEST METHOD

(75) Inventor: Tadahiro Kunii, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 387 days.

(21) Appl. No.: 12/887,128

(22) Filed: Sep. 21, 2010

(65) Prior Publication Data
US 2011/0115495 A1    May 19, 2011

(30) Foreign Application Priority Data
Nov. 13, 2009    (JP) ................. 2009-260115

(51) Int. Cl.
*G01R 31/02* (2006.01)
(52) U.S. Cl. ..................... 324/538; 324/543
(58) Field of Classification Search ............ 324/538, 324/543
See application file for complete search history.

(56) References Cited

U.S. PATENT DOCUMENTS

| | | | |
|---|---|---|---|
| 6,290,543 B1 * | 9/2001 | Plummer et al. ............. | 439/639 |
| 2008/0130185 A1 | 6/2008 | Masghati et al. | |
| 2008/0198527 A1 * | 8/2008 | Higashi et al. ............. | 361/118 |

FOREIGN PATENT DOCUMENTS

| | | |
|---|---|---|
| CN | 101197501 A | 6/2008 |
| CN | 101470145 A | 7/2009 |
| JP | 5-31932 | 2/1993 |
| JP | 5-136578 | 6/1993 |
| JP | 5-243756 | 9/1993 |
| JP | 6-243932 | 9/1994 |
| JP | 7-225634 | 8/1995 |
| JP | 8-250842 | 9/1996 |
| JP | 10-253695 | 9/1998 |
| JP | 10-313532 | 11/1998 |
| JP | 2002-64932 | 2/2002 |

OTHER PUBLICATIONS

Office Action dated Aug. 31, 2012 received from the Chinese Patent Office from related Chinese Application No. 201010292963.5, together with an English-language translation.

* cited by examiner

*Primary Examiner* — Vincent Q Nguyen
(74) *Attorney, Agent, or Firm* — Scully, Scott, Murphy & Presser, P.C.

(57) ABSTRACT

A communication apparatus including: a frame; a transmission line connectable to a public line network; a print circuit board including a frame ground terminal portion and configured such that a dielectric strength between the transmission line and the frame ground terminal portion takes a specific value in a state in which elements are connected to between the transmission line and the frame ground terminal portion via conductor patterns. The frame ground terminal portion includes: a first land formed on a first conductor pattern formed on a face of the print circuit board, a surge protection element being connected to the first conductor pattern; and a second land formed on a second conductor pattern formed on the face, elements different from the surge protection element being connected to the second conductor pattern. The first and second lands contacts the frame by fixing of the print circuit board to the frame.

19 Claims, 7 Drawing Sheets

COMMUNICATION APPARATUS AND WITHSTAND VOLTAGE TEST METHOD

CROSS REFERENCE TO RELATED APPLICATION

The present application claims priority from Japanese Patent Application No. 2009-260115, which was filed on Nov. 13, 2009, the disclosure of which is herein incorporated by reference in its entirety.

BACKGROUND OF THE INVENTION

1. Field of the Invention

The present invention relates to a communication apparatus configured to perform a communication via a public line network and a withstand voltage test method performed for the communication apparatus.

2. Description of the Related Art

Communication apparatuses of various types such as a telephone apparatus, a facsimile apparatus, and a set top box for CATV are each configured to be connected to a corresponding one of external public line networks to perform a communication via the public line network. In such a communication apparatus, a surge protection element such as a gas arrestor is normally connected to between a transmission line to be connected to the public line network and a frame (may be hereinafter referred to as a "frame ground") of the communication apparatus in order to protect the inside of the communication apparatus from an excessive electric energy (i.e., a surge) flowing into the communication apparatus by a lightning strike, for example. In addition to the surge protection element, (a) a condenser for preventing a radiation noise and a static electricity, etc., and (b) various elements and circuits, etc., insulated from the public line network are generally connected to between the frame ground and the transmission line, for example.

It is noted that, as a construction in which the above-described various elements and circuits are connected to the frame ground, there is known a construction in which a terminal to be connected to the frame ground is provided on a print circuit board on which the various elements and circuits including the transmission line are mounted, and the terminal to be connected to the frame ground is brought into contact (conduction) with the frame ground by fixing the print circuit board to the frame.

The surge protection element preferably has a low discharge starting voltage in order to protect the inside of the apparatus from the surge caused by the lightning strike, for example. The use of the surge protection element having the low discharge starting voltage allows the surge protection element to react or to cause an electrical discharge in an early stage (i.e., before the voltage rises to a high level), thereby protecting the inside of the apparatus from the surge.

Meanwhile, a withstand voltage test is performed for such a communication apparatus before the communication apparatus is shipped to a market as a finished product, in order to ensure that the communication apparatus has a constant dielectric strength. Specifically, a specific test voltage (1.5 kV, for example) is applied to between the transmission line and the frame ground for a specific length of time (1 minute, for example), and an electric property therebetween such as a leakage current is measured and evaluated.

As described above, the surge protection element having the low discharge starting voltage is preferably used in order for an increase in a protection performance from the surge. However, if the surge protection element having the low discharge starting voltage (1 kV, for example) is used in the communication apparatus in order for increasing in the protection performance from the surge, the surge protection element discharges electricity in the withstand voltage test, so that the dielectric strength of the communication apparatus cannot be evaluated. That is, an improvement of the surge protection performance and a proper withstand voltage test are traded off.

In order to avoid this problem, the following test method is a possible approach, for example. That is, the withstand voltage test is performed after the surge protection element mounted on the print circuit board by soldering is temporarily removed, and then the surge protection element is mounted again on the print circuit board by soldering after the test is finished. However, such a test method leads to increases in a length of time required for the test and cost and results in an adverse effect on a quality of the product.

In order to solve this problem, there is known a technique that a connector is provided in a path extending from an AC input to a frame ground via a surge protection element in order to easily or simply perform a withstand voltage test, the connector being a connector which is easily inserted and removed and which is for conducting and interrupting the path, for example. In this technique, the withstand voltage test is performed with the connector removed and the path interrupted, and after the test is finished, the path is conducted by the reinsertion of the connector, thereby reducing the length of time required for the withstand voltage test.

SUMMARY OF THE INVENTION

However, in the above-described technique, it is required to additionally provide the connector originally unneeded in order to reliably perform the withstand voltage test while maintaining the surge protection performance at a high level. Accordingly, problems such as complication and upsizing of an apparatus and higher cost are caused.

This invention has been developed in view of the above-described situations, and it is an object of the present invention to perform a withstand voltage test between a frame of an apparatus and a transmission line to be connected to a public line network in a simpler construction and at lower cost while maintaining a surge protection performance performed by a surge protection element to be connected to between the frame and the transmission line at a high level.

The object indicated above may be achieved according to the present invention which provides a communication apparatus comprising: a frame formed by a conductor; a transmission line connectable to a public line network and configured to transmit and receive a signal to and from the public line network in a state in which the transmission line is connected to the public line network; a print circuit board which includes a frame ground terminal portion electrically insulated from the transmission line and which is configured such that a dielectric strength between the transmission line and the frame ground terminal portion takes a specific value in a state in which a plurality of elements including a surge protection element are connected to between the transmission line and the frame ground terminal portion via a plurality of conductor patterns; wherein the frame ground terminal portion is brought into conduction with the frame by fixing of the print circuit board to the frame, wherein the frame ground terminal portion includes: at least one first land formed on an end portion of a first conductor pattern which is one of the plurality of conductor patterns formed on a face of the print circuit board, the surge protection element being connected to the first conductor pattern; and at least one second land electrically insulated from the at least one first land and formed on an end portion of a second conductor pattern which is another of the plurality of conductor patterns formed on the face of the print circuit board, at least one element of the plurality of elements other than the surge protection element being connected to the second conductor pattern, and wherein the frame and the print circuit board are configured such that the at least one first land and the at least one second land is brought into contact with the frame directly or via another conductor by fixing of the print circuit board to the frame.

The object indicated above may also be achieved according to the present invention which provides a withstand voltage test method for the communication apparatus comprising: applying a voltage of a predetermined value to between the transmission line and the at least one second land in a state in which the at least one first land and the at least one second land are insulated from each other; and measuring an electric property between the transmission line and the at least one second land during the application of the voltage.

BRIEF DESCRIPTION OF THE DRAWINGS

The objects, features, advantages, and technical and industrial significance of the present invention will be better understood by reading the following detailed description of embodiments of the invention, when considered in connection with the accompanying drawings, in which.

DESCRIPTION OF THE EMBODIMENTS

Hereinafter, there will be described embodiments of the present invention by reference to the drawings.

Figure 1:
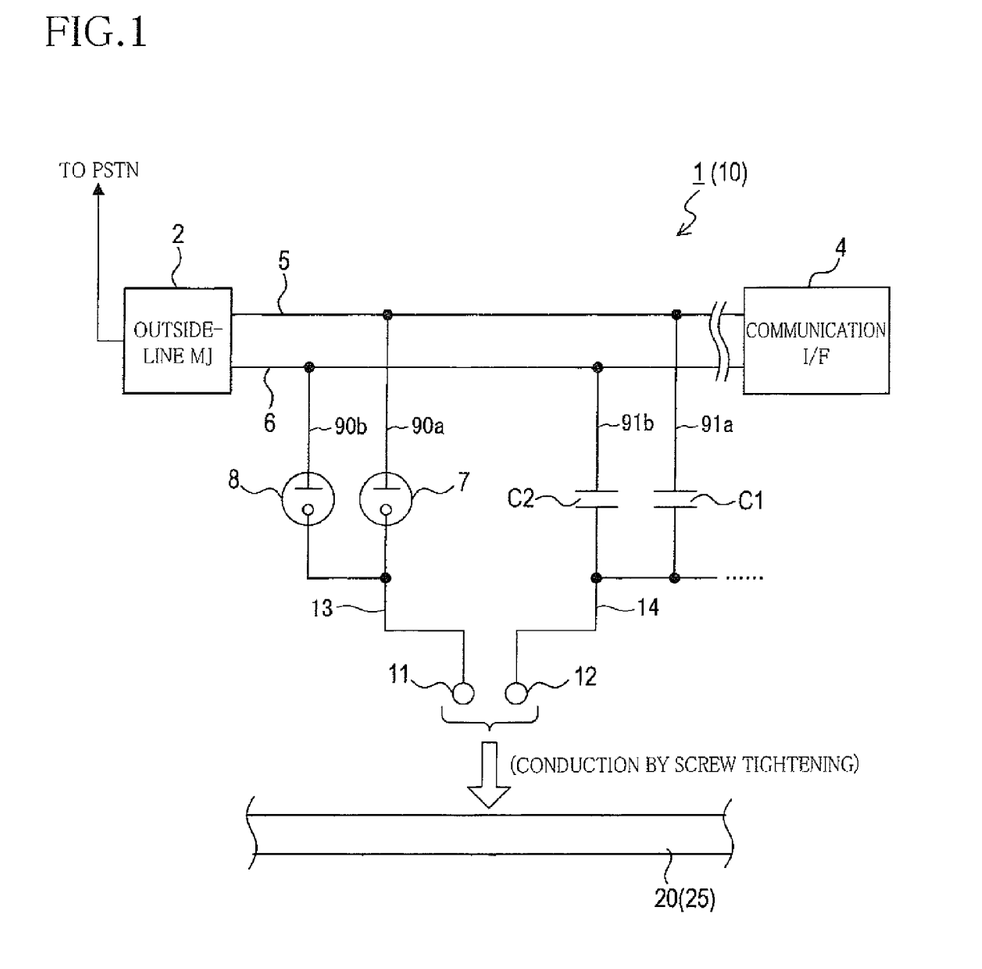
FIG. 1 is a block diagram showing a general construction of a communication apparatus as a first embodiment.

First Embodiment i) Construction of Communication Apparatus
As shown in FIG. 1, a communication apparatus 1 as the present embodiment is configured to be connected to a public switched telephone network (PSTN) which is one of public line networks. The communication apparatus 1 is configured to transmit and receive various signals such as a voice signal and a facsimile signal via this PSTN. The communication apparatus 1 includes: an outside-line modular jack (MJ) 2 to which a connector, not shown, for connecting the communication apparatus 1 to the PSTN is connected; two transmission lines 5, 6 through which the various signals transmitted and received via the outside-line MJ 2 are transmitted; and a communication interface (I/F) 4 connected to end portions of the respective transmission lines 5, 6 which are opposite to the other end portions thereof to which the outside-line MJ 2 is connected.

Specifically, the communication 4 includes (a) a semiconductor DAA (data access arrangement) as an interface which connects an external PSTN and the communication apparatus 1 and (b) a modem for a facsimile communication, for example.

It is noted that the communication apparatus 1 includes (a) a controller for controlling entire communicating operations such as processings for the voice signal and the facsimile signal and (b) various circuits, various units, and so on such as a user interface, but illustration thereof is omitted in FIG. 1.

The outside-line MJ 2 and the two transmission lines 5, 6 are constituted as a print circuit board 10 together with two gas arrestors 7, 8, two condensers C1, C2, and two frame ground terminals 11, 12 which will be described below. This print circuit board 10 is provided with an external-phone MJ 3 (with reference to FIGS. 2A and 2B) for connecting an externally connected telephone device as will be described below, but illustration thereof is omitted in FIG. 1. It is noted that the print circuit board 10 constitutes a network control unit (NCU) of the communication apparatus 1 and for this reason may be hereinafter referred to as an NCU board.

On the NCU board 10, frame ground terminals as a frame ground terminal portion to be brought into contact and conduction with a frame 20 (i.e., a frame ground) of the communication apparatus 1 are provided so as to be separated or distant from each other. Specifically, the first frame ground terminal 11 and the second frame ground terminal 12 are provided so as to be separated from each other.

The gas arrestor 7 is provided and connected to between the transmission line 5 and the first frame ground terminal 11. The gas arrestor 8 is provided and connected to between the transmission line 6 and the first frame ground terminal 11. More specifically, one end of the gas arrestor 7 is connected to the transmission line 5 via a connection line 90a as a conductor pattern, and the other end of the gas arrestor 7 is connected to the first frame ground terminal 11 via a first frame ground pattern 13 as a first conductor pattern. Further, one end of the gas arrestor 8 is connected to the transmission line 6 via a connection line 90b as a conductor pattern, and the other end of the gas arrestor 8 is connected to the first frame ground terminal 11 via the first frame ground pattern 13.

Each of the gas arrestors 7, 8 is a surge protection element for protecting the inside of the communication apparatus 1 from a surge caused by a lightning strike. In the present embodiment, each of the gas arrestors 7, 8 has a relatively low discharge starting voltage in which an electrical discharge starts at 1 kV, for example, in order to improve a strength against lightning, i.e., to enhance a protection performance against the surge. Thus, even where the surge has flowed into the communication apparatus 1, it is possible to dissipate the surge into the frame ground by the quick electrical discharge of the gas arrestors 7, 8, thereby effectively protecting the inside of the apparatus from the surge.

The condenser C1 is provided and connected to between the transmission line 5 and the second frame ground terminal 12. The condenser C2 is provided and connected to between the transmission line 6 and the second frame ground terminal 12. More specifically, one end of the condenser C1 is connected to the transmission line 5 via a connection line 91a as a conductor pattern, and the other end of the condenser C1 is connected to the second frame ground terminal 12 via a second frame ground pattern 14 as a second conductor pattern. Further, one end of the condenser C2 is connected to the transmission line 6 via a connection line 91b as a conductor pattern, and the other end of the condenser C2 is connected to the second frame ground terminal 12 via the second frame ground pattern 14. These condensers C1, C2 are provided for preventing a radiation noise and a static electricity, and so on.

It is noted that, though not shown, to the second frame ground terminal 12 are connected, e.g., (a) an end of a relay coil for opening or closing a relay contact which is inserted into between at least one of the transmission lines 5, 6, and the second frame ground terminal 12 (b) an end of a secondary winding of a transformer provided between each of the transmission lines 5, 6 and the second frame ground terminal 12 for insulating the transmission lines 5, 6 from the inside of the apparatus, and so on, in addition to the condensers C1, C2.

A dielectric strength between each of the transmission lines 5, 6 and the corresponding one of the frame ground terminals 11, 12 takes a specific value. The frame ground terminals 11, 12 are insulated from each other in a state in which the NCU board 10 is separated from the frame 20. However, when the communication apparatus 1 is shipped as a finished product, this NCU board 10 is fixed to the frame 20 by screw tightening, whereby both of the frame ground terminals 11, 12 are held in contact and conduction with the frame 20 (specifically with a terminal contact piece 25 which will be described below). The frame 20 is formed by processing of a conductive plate such as a steel plate, for example. That is, the frame 20 is formed by a conductor. Thus, when the surge has been flowed into the apparatus, it is possible to dissipate the surge into the frame 20 (the frame ground) via the gas arrestors 7, 8.

For shipping the communication apparatus 1 to a market, it is required to perform a withstand voltage test for checking whether or not the dielectric strength between each of the transmission lines 5, 6 and the corresponding one of the frame ground terminals 11, 12 takes the specific value. As will be described below, the withstand voltage test is performed in the state in which the NCU board 10 is not fixed to the frame 20 or separated from the frame 20 in the present embodiment. Further, the withstand voltage test is performed by applying a test voltage to between the transmission lines 5, 6 and the second frame ground terminal 12 of the two frame ground terminals 11, 12.

Figure 2A:
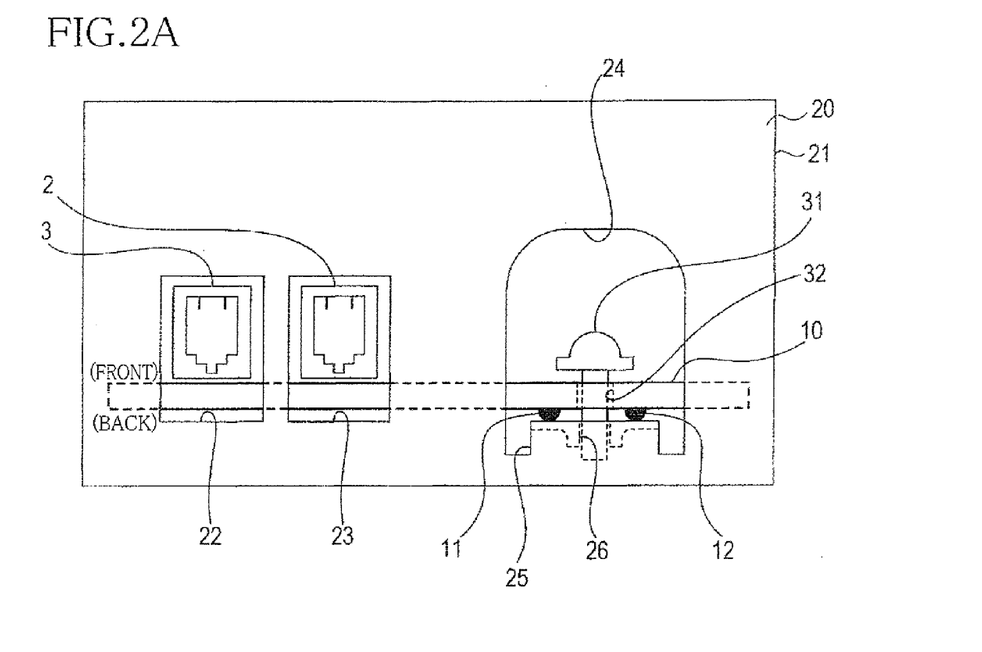
FIGS. 2A and 2B are respectively a front elevational view and a plan view showing a frame to which an NCU board is fixed (in a state in which screw tightening has not been completed) in the communication apparatus as the first embodiment.
Figure 2B:
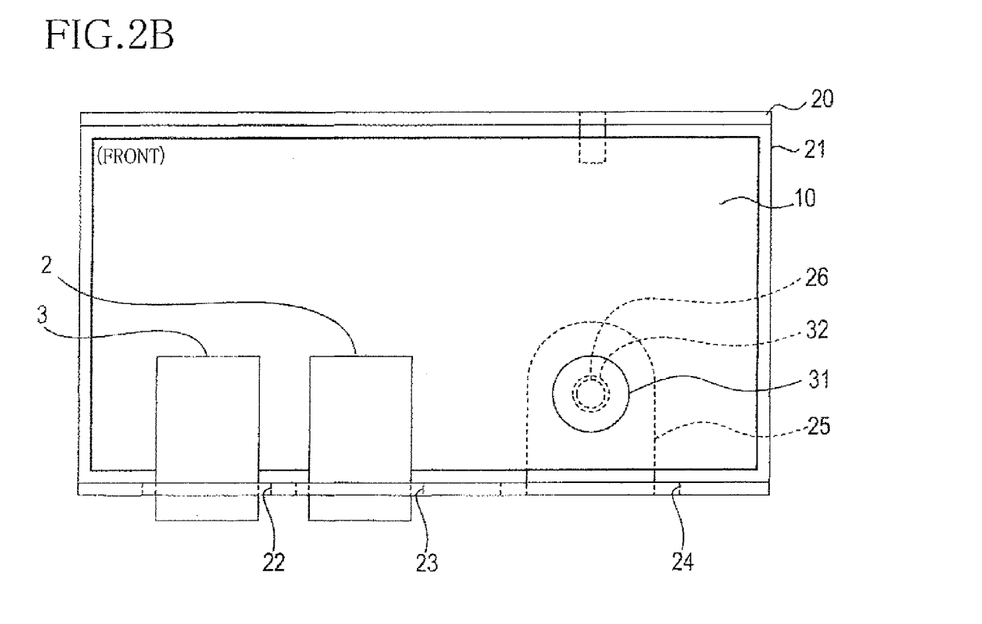
Figure 3:
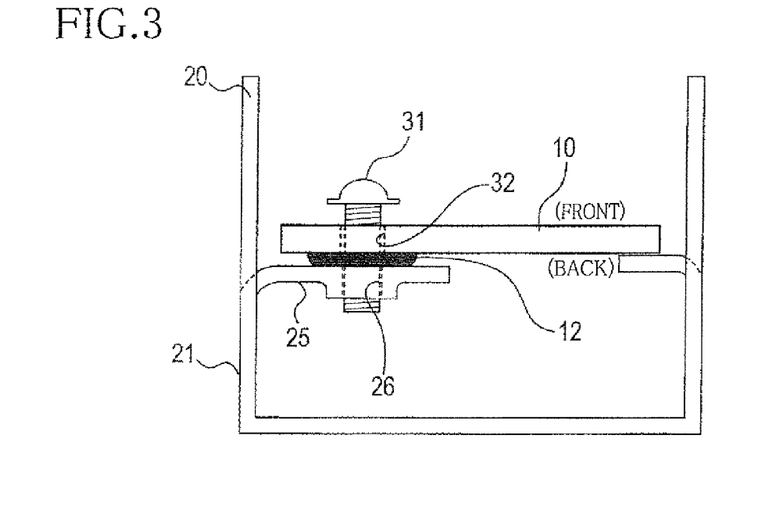
FIG. 3 is a side view showing the frame to which the NCU board is fixed (in the state in which the screw tightening has not been completed) in the communication apparatus as the first embodiment.
Figure 4:
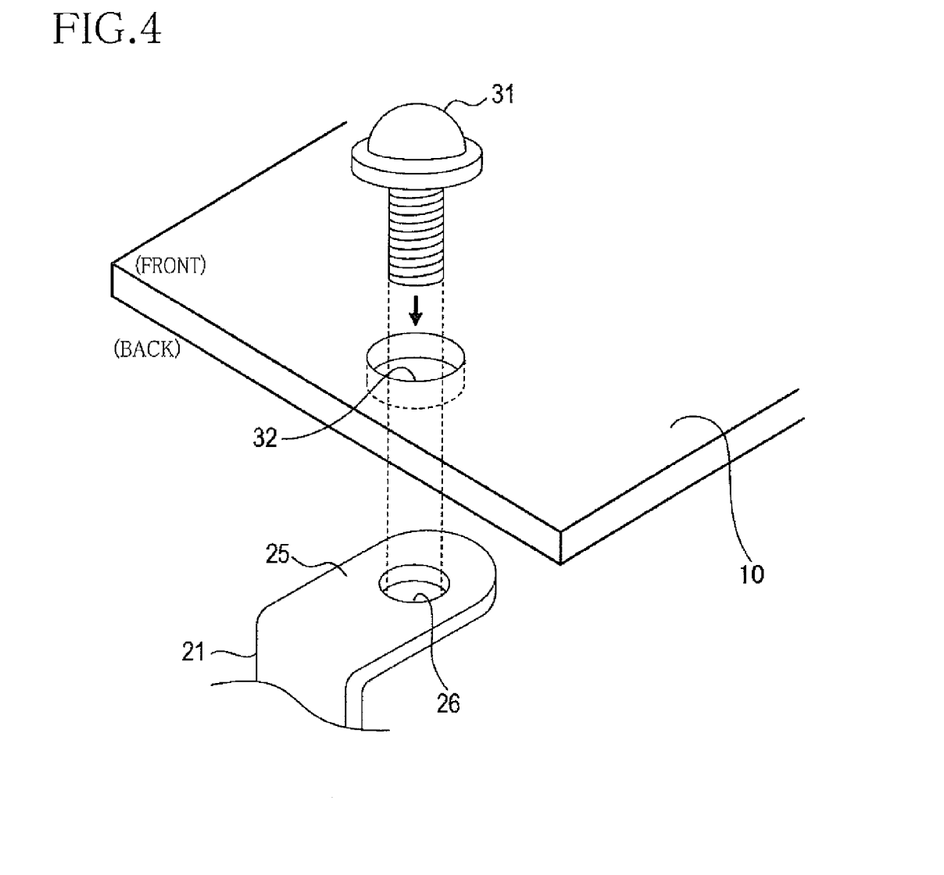
FIG. 4 is a perspective view for explaining that the NCU board is fixed to the frame by a screw.

There will be next explained the fixing of the NCU board 10 to the frame 20 with reference to FIGS. 2 to 4. It is noted that FIGS. 2 and 3 show the NCU board 10 fixed to the frame 20 in a state in which a screw 31 as a fastening member has not been completely tightened.

As shown in FIGS. 2 and 3, the frame 20 mainly includes (a) a frame main body 21 formed by a bent steel plate such that an upper side of the frame main body 21 is made open and (b) the terminal contact piece 25 formed so as to be bent and projected from an edge of the frame main body 21 (specifically an edge of a third opening 24).

A first opening 22, a second opening 23, and the third opening 24 are formed in a plate face as a front face of the frame main body 21. The first opening 22 is formed such that a distal end of the external-phone MJ 3 is projected from or through this first opening 22 when the NCU board 10 is fixed to the frame 20. The second opening 23 is formed such that a distal end of the outside-line MJ 2 is projected from or through this second opening 23 when the NCU board 10 is fixed to the frame 20.

The terminal contact piece 25 is formed so as to be bent from the edge of the third opening in a direction perpendicular to the plate face in which the third opening 24 is formed and so as to be projected from the plate face. A distal end of the terminal contact piece 25 has an arc shape. In the terminal contact piece 25, there is formed a frame-side screw hole 26 as an example of a cylindrical or circular insertion hole through which the screw 31 is inserted when the NCU board 10 is fixed to the frame 20 by the screw tightening.

Components and elements such as the MJs 2, 3, the gas arrestors 7, 8, and the condensers C1, C2 are mounted on a front (upper) face as one of opposite faces of the NCU board 10. The conductor patterns 13, 14, 90a, 90b, 91a, 91b formed of beaten copper and the frame ground terminals 11, 12 are formed on a back (lower) face as the other of the opposite faces of the NCU board 10. In the NCU board 10, there is formed a board-side screw hole 32 as an example of the insertion hole through which the screw 31 is inserted when the NCU board 10 is fixed to the frame 20 by the screw tightening.

When the NCU board 10 is fixed to the frame 20, the NCU board 10 is placed on an upper face of the terminal contact piece 25 in the frame 20 such that the board-side screw hole 32 formed in the NCU board 10 is aligned with the frame-side screw hole 26 formed in the frame 20. As shown in FIG. 4, the screw 31 is inserted through the screw holes 32, 26 in this state, whereby the NCU board 10 is fastened or fixed to the frame 20. That is, the screw 31, the screw holes 32, 26, and portions of the NCU board 10 and the frame 20 which define the respective screw holes 32, 26 function as a fastening mechanism.

When the NCU board 10 has been fixed to the frame 20, the first frame ground terminal 11 and the second frame ground terminal 12 formed on the back face of the NCU board 10 are brought into contact with the terminal contact piece 25 of the frame 20. As a result, both of the frame ground terminals 11, 12 are brought into conduction with the frame 20.

It is noted that the frame ground terminals 11, 12 are formed by attaching solder onto lands formed on end portions of the respective conductor patterns 13, 14, 90a, 90b, 91a, 91b on the back face of the NCU board 10, but a detailed construction thereof will be described later.

ii) Detailed Construction of Frame Ground Terminal Portion (Frame Ground Terminals 11, 12)

Figure 5A:
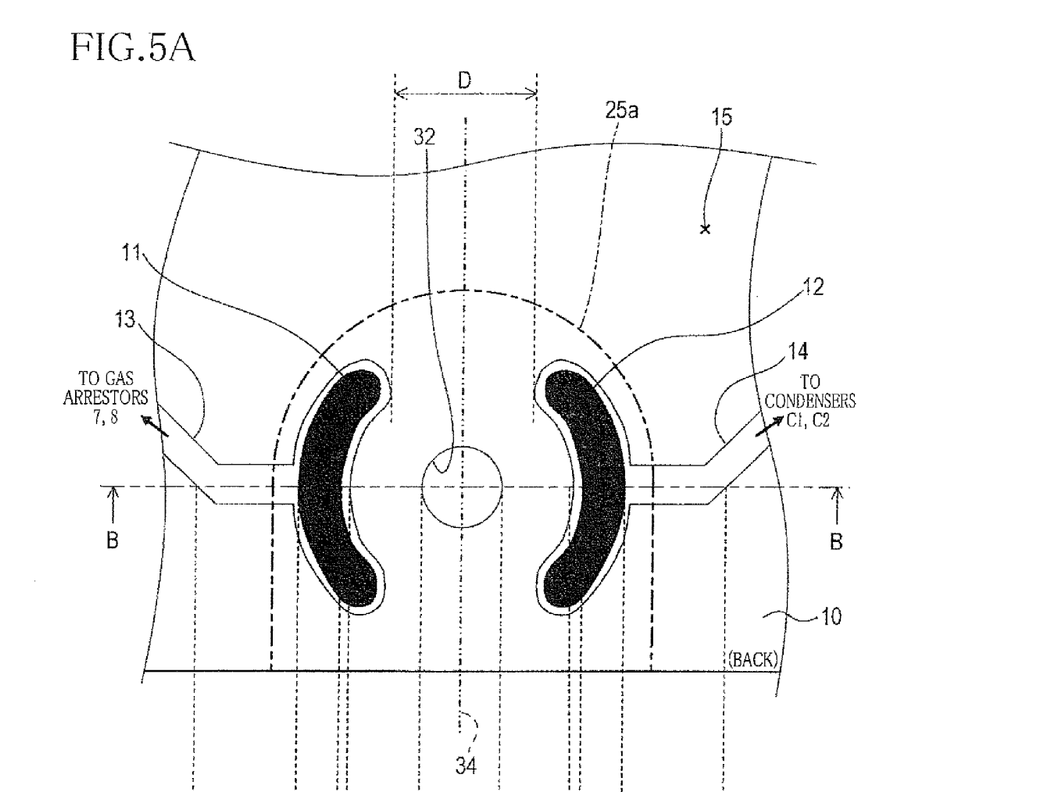
FIG. 5A is a plan view showing a back side of the NCU board in the first embodiment for explaining a position and a shape of each frame ground terminal.
Figure 5B:
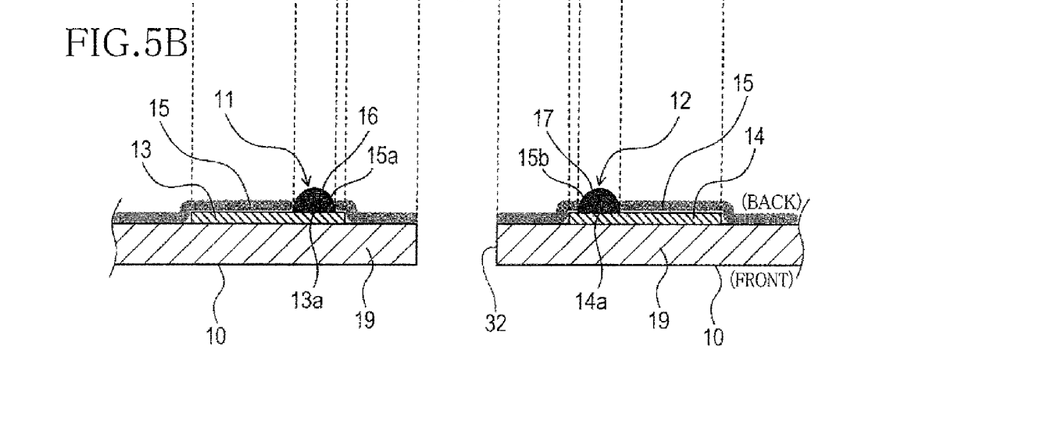
FIG. 5B is a cross-sectional view showing a cross section of FIG. 5A taken along a line B-B.
Figure 6:
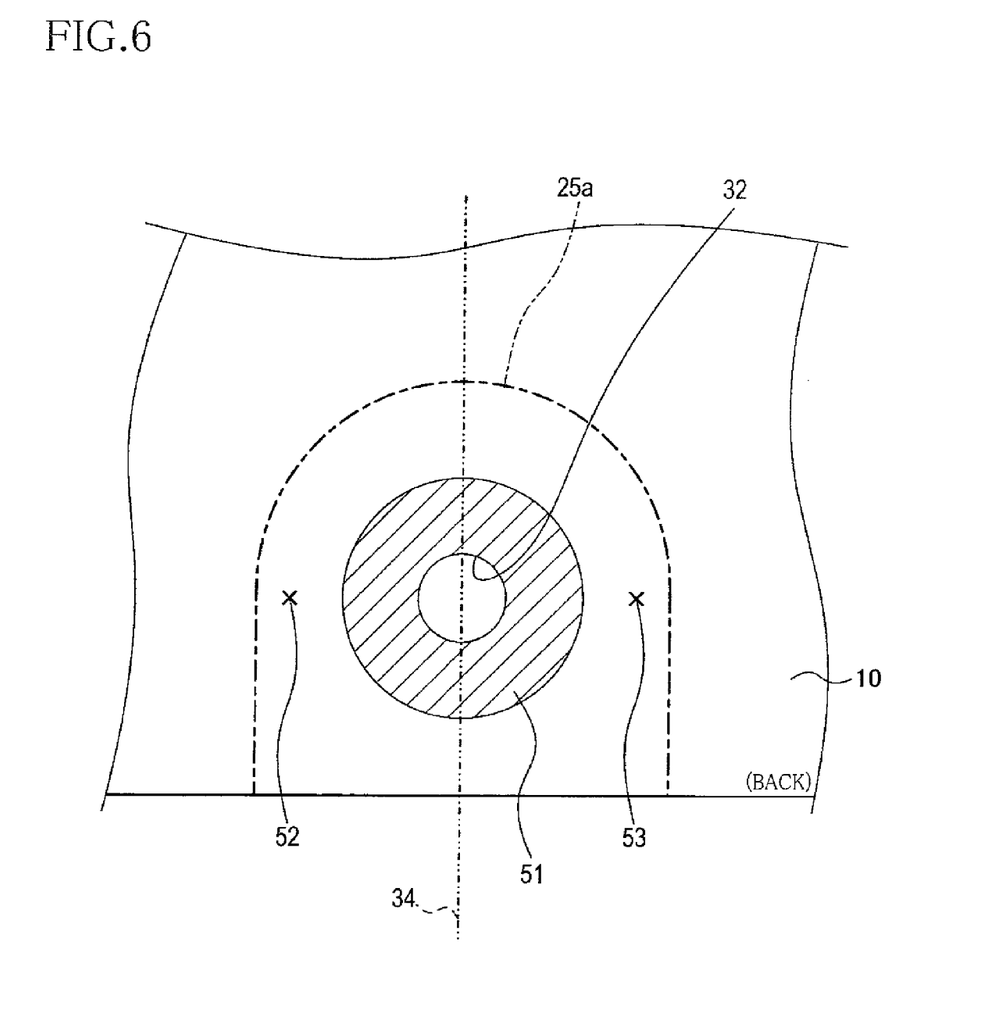
FIG. 6 is a view for explaining an area of the NCU board in which the frame ground terminal can be formed.

There will be next explained the detailed construction of the frame ground terminals 11, 12 as the frame ground terminal portion with reference to FIGS. 5A, 5B, and 6.

As shown in FIGS. 5A and 5B, the NCU board 10 includes a substrate 19 formed of paper phenol, glass epoxy, and so on. The conductor patterns 13, 14, 90a, 90b, 91a, 91b formed of the beaten copper are formed on a back face of the substrate 19. As the conductor patterns, there are formed (a) the first frame ground pattern 13 to which one end of each of the gas arrestors 7, 8 is connected and (b) the second frame ground pattern 14 to which one end of each of the condensers C1, C2 is connected. Each of distal ends of the frame ground patterns 13, 14 has an arc shape as shown in FIG. 5A.

A solder resist (a soldermask) 15 is applied onto the back face of the NCU board 10 in order that no solder is attached onto unintended areas in a soldering process (a flow method in the present embodiment). Resist openings are appropriately formed in areas of the solder resist 15 which are required for the soldering. As the resist openings, at least a first resist opening 15a and a second resist opening 15b are formed (with reference to FIG. 5B).

The first resist opening 15a is formed in an arc shape so as to expose an internal area (an arc-shaped area) of the arc-shaped conductor pattern formed on the end portion of the first frame ground pattern 13. The end portion of the first frame ground pattern 13 includes an arc-shaped first land 13a exposed from the arc-shaped first resist opening 15a. The solder is attached to and formed on this first land 13a in the soldering process.

Thus, an arc-shaped first solder 16 is attached to and formed on the first land 13a in the soldering process. The first frame ground terminal 11 is constituted by the first land 13a and the first solder 16. That is, specifically explained, when the first frame ground terminal 11 is brought into contact and conduction with the terminal contact piece 25 of the frame 20, the first solder 16 is brought into contact with the terminal contact piece 25, and thereby the terminal contact piece 25 and the first land 13a are brought into conduction with each other via the first solder 16, whereby the frame 20 and the first frame ground pattern 13 are brought into conduction with each other.

Like the first resist opening 15a, the second resist opening 15b is formed in an arc shape so as to expose an internal area (an arc-shaped area) of the arc-shaped conductor pattern formed on the end portion of the second frame ground pattern 14. The end portion of the second frame ground pattern 14 includes an arc-shaped second land 14a exposed from the arc-shaped second resist opening 15b. The solder is attached to and formed on this second land 14a in the soldering process.

Thus, an arc-shaped second solder 17 is attached to and formed on the second land 14a in the soldering process. The second frame ground terminal 12 is constituted by the second land 14a and the second solder 17. That is, specifically explained, when the second frame ground terminal 12 is brought into contact and conduction with the terminal contact piece 25 of the frame 20, the second solder 17 is brought into contact with the terminal contact piece 25, and thereby the terminal contact piece 25 and the second land 14a are brought into conduction with each other via the second solder 17, whereby the frame 20 and the second frame ground pattern 14 are brought into conduction with each other.

There will be next explained a shape and a relative positional relationship of the frame ground terminals 11, 12 in more detail. It is noted that, in the following explanation, where a term "shape" is used for each of the frame ground terminals 11, 12, the term also indicates a shape of the corresponding one of the lands 13a, 14a and a shape of the corresponding one of the resist openings 15a, 15b. Further, where a term "position" is used for each of the frame ground terminals 11, 12, the term also indicates a position of the corresponding one of the lands 13a, 14a and a position of the corresponding one of the resist openings 15a, 15b.

As shown in FIG. 5A, the frame ground terminals 11, 12 are symmetric in shape and position with each other with respect to or about a boundary line 34 passing through a center of the board-side screw hole 32. The boundary line 34 is a straight line parallel to the plate face of the NCU board 10 and parallel to a direction in which the terminal contact piece 25 is projected.

Here, there will be explained, with reference to FIGS. 5A, 5B, and 6, forming conditions on which the frame ground patterns 13, 14 and the frame ground terminals 11, 12 are formed in the present embodiment. In the present embodiment, the following conditions (a) to (e) are set as the forming conditions on which the frame ground terminals 11, 12 and the frame ground patterns 13, 14 are formed.

(a) forming the frame ground terminals 11, 12 so as to be symmetric in position with each other with respect to the boundary line 34

(b) forming the frame ground terminals 11, 12 in a terminal-contact-piece facing area 25a which faces or completely overlaps with the plate face of the terminal contact piece 25 in a direction perpendicular to the plate face when the NCU board 10 is fixed to the frame 20

(c) forming the frame ground terminals 11, 12 at positions different from a position at which is formed a land unformable area 51 (with reference to FIG. 6) whose distance from the center of the board-side screw hole 32 is shorter than a predetermined distance, that is, forming the frame ground terminals 11, 12 at positions distant from a position of the center of the board-side screw hole 32 by the predetermined distance (d) setting the number of each of the frame ground terminals 11, 12 at one or two (e) setting a conductor distance D between the first frame ground pattern 13 and the second frame ground pattern 14 at a distance longer than a specific distance The forming condition (a) is for ensuring insulation between the frame ground terminals 11, 12 and for reliably bringing the frame ground terminals 11, 12 into contact with the terminal contact piece 25. It is noted that the frame ground terminals 11, 12 are not necessarily formed so as to be symmetric in shape with each other with respect to the boundary line 34. However, in order to stably bring and hold the frame ground terminals 11, 12 into and in contact with the terminal contact piece 25, the frame ground terminals 11, 12 are preferably formed so as to be symmetric also in shape with each other with respect to the boundary line 34. As apparent from FIG. 5A, the frame ground terminals 11, 12 in the present embodiment are formed so as to be symmetric also in shape with each other with respect to the boundary line 34.

Further, the boundary line 34 is the line parallel to the direction in which the terminal contact piece 25 is projected. This is for the following reason. That is, the terminal contact piece 25 is bent at a right angle (90 degrees) to the frame main body 21 of the frame 20, but in reality, this bending angle cannot be always determined to be the right angle. That is, the bending angle may be determined to be slightly smaller or larger than the right angle.

Where the bending angle is an angle different from the right angle, there is a possibility that the plate face of the NCU board 10 and the plate face of the terminal contact piece 25 are not parallel to each other when the NCU board 10 is placed on the specific position in order to be fixed to the frame 20, thereby making it difficult to bring both of the frame ground terminals 11, 12 into contact with the terminal contact piece 25.

Thus, in order to reliably bring both of the frame ground terminals 11, 12 into contact with the terminal contact piece 25 even where the bending angle is not accurately determined to be the right angle, the frame ground terminals 11, 12 are formed so as to be symmetric in position with each other with respect to the boundary line 34 which is the line parallel to the direction in which the terminal contact piece 25 is projected (i.e., a direction in which the terminal contact piece 25 is projected from the plate face as a front face of the frame main body 21 where the bending angle is the right angle).

The forming condition (b) is necessary because both of the frame ground terminals 11, 12 need to be brought into contact with the terminal contact piece 25. The forming condition (c) is for reliably bringing the frame ground terminals 11, 12 into contact with the terminal contact piece 25 even where the solders 16, 17 respectively constituting the frame ground terminals 11, 12 have different shapes from each other. The solders 16, 17 are not always formed so as to have even amount, shape, and height (i.e., a height from the back face in a direction perpendicular to the plate face), which may lead to unevenness between the solders 16, 17. Thus, if one of the solders 16, 17 is higher than the other thereof where the frame ground terminals 11, 12 are formed at positions just near the center of the board-side screw hole 32, the following problem may occur. That is, when the NCU board 10 is fastened to the terminal contact piece 25 by the screw 31, the one of the solders 16, 17 formed higher than the other is first brought into contact with the terminal contact piece 25, and even where the screw 31 is continued to be further tightened thereafter, the other of the solders 16, 17 may not be brought into contact with the terminal contact piece 25.

In order to solve this problem, the frame ground terminals 11, 12 need to be formed so as to be distant from the center of the board-side screw hole 32 by equal to or more than the predetermined distance (that is, the frame ground terminal 11, 12 need to be formed at positions relatively far from the center of the board-side screw hole 32). In this configuration, even if the one of the solders 16, 17 higher than the other is first brought into contact with the terminal contact piece 25, further tightening of the screw 31 allows the other of the solders 16, 17 to approach toward the terminal contact piece 25 to be eventually brought into contact with the terminal contact piece 25.

It is noted that, where the forming conditions (a) to (c) are summarized, as shown in FIG. 6, the first frame ground terminal 11 needs only to be formed in a first land formable area 52, and the second frame ground terminal 12 needs only to be formed in a second land formable area 53.

The forming condition (d) is for simply forming the frame ground terminals 11, 12 and for reliably bringing both of the frame ground terminals 11, 12 into contact with the terminal contact piece 25. If the number of the first frame ground terminals 11 is equal to or more than three, a hypothetical plane may be formed by these three first frame ground terminals when the three frame ground terminals 11 are brought into contact with the terminal contact piece 25, which may pose the following problem. That is, where these first frame ground terminals 11 have been first brought into contact with the terminal contact piece 25, the second frame ground terminal 12 may not be brought into contact with the terminal contact piece 25.

In order to reliably bring both of the frame ground terminals 11, 12 into contact with the terminal contact piece 25, the number of each of the frame ground terminals 11, 12 is preferably set to one or two (i.e., less than three).

However, in reality, even where equal to or more than three frame ground terminals are formed on one side of the boundary line 34 and these frame ground terminals have been first brought into contact with the terminal contact piece 25, further tightening of the screw 31 allows frame ground terminals formed on the other side to be also brought into contact with the terminal contact piece 25. That is, where the screw 31 is continued to be further tightened, a frame ground terminal located on the furthest position from the board-side screw hole 32 among the frame ground terminals on the one side is gradually moved upward from the terminal contact piece 25 by the tightening force in a state in which a frame ground terminal located on the nearest position to the board-side screw hole 32 among the frame ground terminals on the one side functions as a fulcrum. In contrast, the frame ground terminals located on the other side of the boundary line 34 approach toward the terminal contact piece 25 to be eventually brought into contact with the terminal contact piece 25.

Thus, the forming condition (d) is preferably satisfied, but this communication apparatus 1 may be configured such that equal to or more than three frame ground terminals are formed on one side of the boundary line 34.

The forming condition (e) is for not causing an electrical discharge between the first frame ground pattern 13 and the second frame ground pattern 14 in the withstand voltage test. As will be described below, a voltage of 1.5 kV is applied to between the transmission lines 5, 6 and the second frame ground terminal 12 in the withstand voltage test in the present embodiment. Accordingly, the conductor distance D is set at a distance equal to or longer than 2 mm in order not to cause the electrical discharge between the frame ground patterns 13, 14.

In the present embodiment, each of the frame ground terminals 11, 12 is formed in the arc shape about the center of the board-side screw hole 32 while satisfying the forming conditions (a) to (e). As described above, each of the frame ground terminals 11, 12 may be formed at any position and in any shape as long as the frame ground terminals 11, 12 are located in the respective land formable areas 52, 53 (with reference to FIG. 6). However, each of the frame ground terminals 11, 12 is preferably formed so as to extend in a circumferential direction of a circle centered at the center of the board-side screw hole 32 and so as to set a width of a circle about the board-side screw hole 32 in a radial direction thereof to become smaller. Thus, each of the frame ground terminals 11, 12 is formed in the arc shape in the present embodiment.

iii) Withstand Voltage Test

There will be next generally explained the withstand voltage test performed for the communication apparatus 1 as the present embodiment. The withstand voltage test in the present embodiment is performed in the state in which the NCU board 10 is removed from the frame 20 or separated from the frame 20 (that is, in the state in which the frame ground terminals 11, 12 are insulated from each other).

In the state in which the NCU board 10 is not fixed to the frame 20, short circuit is initially caused in the transmission lines 5, 6, and then a specific test voltage (1.5 kV in this example) is applied to between the transmission lines 5, 6 and the second frame ground terminal 12 for a specific length of time (1 minute in this example). Then, an electric property (e.g., a leakage current) between the transmission lines 5, 6 and the second frame ground terminal 12 during the application of the voltage is measured, and the dielectric strength is evaluated on the basis of a result of this measurement.

After the withstand voltage test, the communication apparatus 1 is shipped to the market in the state in which the NCU board 10 is fixed to the frame 20 and both of the frame ground terminals 11, 12 are held in conduction with the frame 20. It is noted that the short circuit in the transmission lines 5, 6 is not essential, and the dielectric strength may be tested for the transmission lines 5, 6 separately.

iv) Effects, etc., in First Embodiment

According to the communication apparatus 1 as the present embodiment explained above, the frame ground terminal portion which is to be brought into contact and conduction with the frame 20 in the NCU board 10 is separated into the first frame ground terminal 11 to which the gas arrestors 7, 8 are connected and the second frame ground terminal 12 to which the other elements (e.g., the condensers C1, C2) are connected. This simple construction makes it possible to maintain the protection performance from the surge at a high level and to reliably perform the withstand voltage test. That is, a tradeoff between an improvement of the surge protection performance and a proper withstand voltage test does not need to be considered, thereby eliminating an effect to the withstand voltage test even where a gas arrestor having a low discharge starting voltage (i.e., a gas arrestor having a high surge protection performance) is used. Further, such a simple structure makes it possible to suppress increase in cost in the communication apparatus 1 and to suppress increases in a length of time required for the withstand voltage test and cost in the withstand voltage test.

Further, despite the simple construction in which the NCU board 10 is fastened to the frame 20 by the single screw 31, it is possible to satisfactorily fix the NCU board 10 to the frame 20 and bring both of the frame ground terminals 11, 12 of the NCU board 10 into contact and conduction with the terminal contact piece 25 of the frame 20.

Further, the frame ground terminals 11, 12 are formed at the positions distant from the center of the board-side screw hole 32 by equal to or more than the predetermined distance. Thus, even if the one of the solders 16, 17 is higher than the other and first brought into contact with the terminal contact piece 25, further tightening of the screw 31 allows the other of the solders 16, 17 to approach toward the terminal contact piece 25 to be eventually brought into contact with the terminal contact piece 25.

Further, the frame ground terminals 11, 12 are formed separately on two areas divided by the boundary line 34 passing through the center of the board-side screw hole 32. Thus, it is possible to reliably bring both of the frame ground terminals 11, 12 into contact with the terminal contact piece 25. Further, the frame ground terminals 11, 12 can be distant from each other, thereby preventing the electrical discharge from occurring between the frame ground terminals 11, 12 during the withstand voltage test.

Further, the boundary line 34 is the line parallel to the direction in which the terminal contact piece 25 is projected, and the frame ground terminals 11, 12 are formed so as to be symmetric in position with each other with respect to the boundary line 34. Thus, even where the bending angle of the terminal contact piece 25 is not accurately 90 degrees, it is possible to reliably bring both of the frame ground terminals 11, 12 into contact with the terminal contact piece 25.

Further, each of the frame ground terminals 11, 12 is formed in the arc shape. Thus, each of the frame ground terminals 11, 12 can be formed in a simple manner and at low cost. Further, since each of the frame ground terminals 11, 12 has the arc shape having a small width, each of the frame ground terminals 11, 12 can be distant from the board-side screw hole 32 in its entirety, thereby reliably bringing both of the frame ground terminals 11, 12 into contact with the terminal contact piece 25.

Further, the frame ground terminals 11, 12 are formed so as to be symmetric in shape (i.e., the arc shape) with each other with respect to the boundary line 34 in addition to the position. Thus, the frame ground terminals 11, 12 are balanced with each other in position and shape, thereby further reliably bringing both of the frame ground terminals 11, 12 into contact with the terminal contact piece 25.

Second Embodiment

Figure 7:
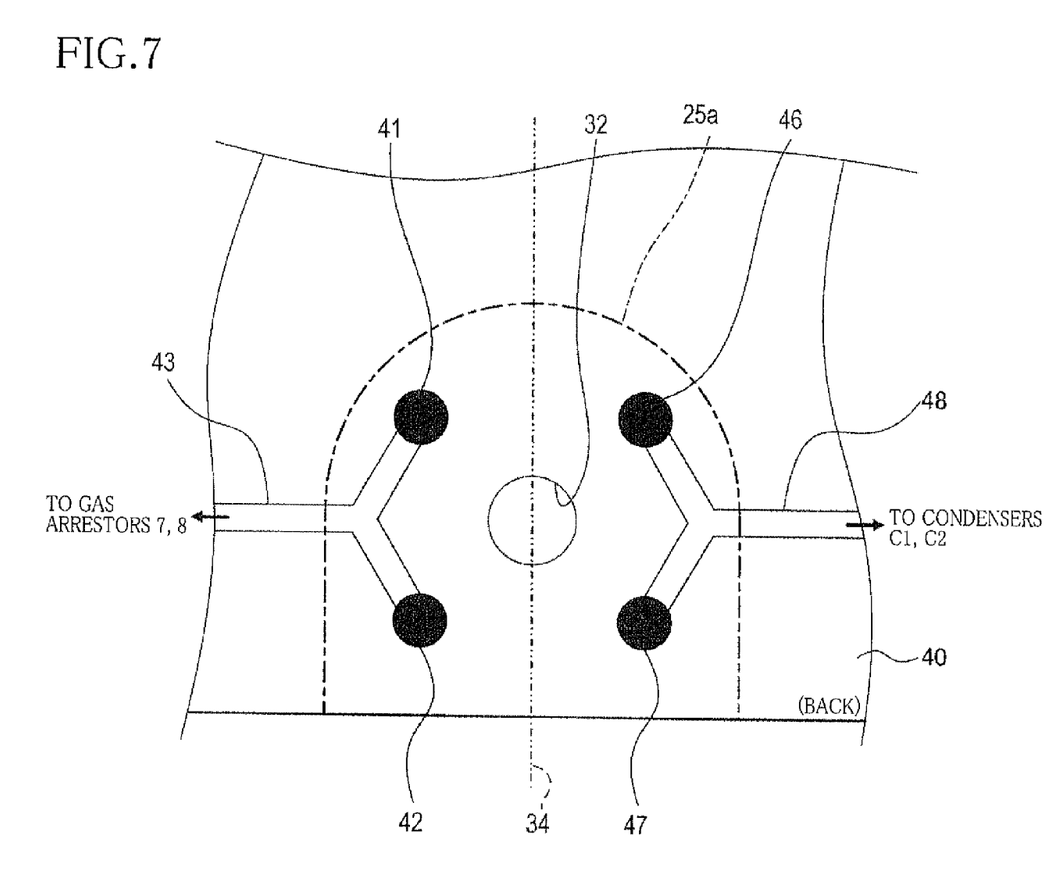
FIG. 7 is a plan view showing an NCU board in a second embodiment for explaining a position and a shape of each frame ground terminal.

There will be next explained an NCU board in a second embodiment with reference to FIG. 7. An NCU board 40 in this second embodiment shown in FIG. 7 is the same as the NCU board 10 in the first embodiment except for a shape of each frame ground terminal and a shape of each conductor pattern near a corresponding frame ground terminal. Thus, the same reference numerals as used in the first embodiment are used to designate corresponding elements in the second embodiment which are the same as those in the NCU board 10 in the first embodiment.

On the NCU board 40 in the present embodiment shown in FIG. 7, there is provided a first frame ground pattern 43 to which the gas arrestors 7, 8 are connected. A distal end portion of the first frame ground pattern 43 is separated or bifurcated into two parts. First frame ground terminals 41, 42 each having a circular shape are respectively foamed on distal ends of the respective two parts of the first frame ground pattern 43. On the NCU board 40, there is provided a second frame ground pattern 48 to which the condensers C1, C2 are connected. The second frame ground pattern 48 has a shape similar to the first frame ground pattern 43. That is, a distal end portion of the second frame ground pattern 48 is separated or bifurcated into two parts. Second frame ground terminals 46, 47 each having a circular shape are respectively formed on distal ends of the respective two parts of the second frame ground pattern 48.

The two first frame ground terminals 41, 42 and the two second frame ground terminals 46, 47 are formed so as to satisfy the five conditions (a) to (e) explained in the first embodiment. That is, the first frame ground terminals 41, 42 are formed in the first land formable area 52 shown in FIG. 6. The second frame ground terminals 46, 47 are formed in the second land formable area 53 shown in FIG. 6. The first frame ground terminals 41, 42 and the second frame ground terminals 46, 47 are arranged so as to be symmetric with each other with respect to the boundary line 34.

Further, on the NCU board 40 in the present embodiment, the frame ground terminals 41, 42, 46, 47 are arranged in the circumferential direction of the circle about the center of the board-side screw hole 32. That is, the frame ground terminals 41, 42, 46, 47 are formed so as to be distant from the center of the board-side screw hole 32 by the same distance. Further, the first frame ground terminals 41, 42 to which the gas arrestors 7, 8 are connected are arranged in a direction parallel to the boundary line 34. Likewise, the second frame ground terminals 46, 47 to which the condensers C1, C2 are connected are arranged in the direction parallel to the boundary line 34. It is noted that each of the first frame ground terminals 41, 42 in the present embodiment includes the first land and the first solder like those in the first embodiment. Further, each of the second frame ground terminals 46, 47 includes the second land and the second solder. When the NCU board 10 is fixed to the frame 20, the first solders of the respective first frame ground terminals 41, 42 and the second solders of the respective second frame ground terminals 46, 47 are brought into direct contact with the terminal contact piece 25, so that the first frame ground terminals 41, 42 and the second frame ground terminals 46, 47 are brought into conduction with the frame 20.

As thus described, on the NCU board 40 are provided the two first frame ground terminals 41, 42 to which the gas arrestors 7, 8 are connected and the two second frame ground terminals 46, 47 to which the condensers C1, C2 are connected. Thus, it is possible to prevent that a plane is formed by the frame ground terminals on one side of the boundary line 34 and to reliably bring the frame ground terminals 41, 42, 46, 47 into contact with the terminal contact piece 25.

Further, since the two first frame ground terminals (the first frame ground terminals 41, 42) and the two second frame ground terminals (the second frame ground terminals 46, 47) are formed, at least one of each pair of the frame ground terminals 41, 42, 46, 47 may be brought into contact with the terminal contact piece 25 (of course, both of the two frame ground terminals are preferably brought into contact with the terminal contact piece 25). This is because at least three of the frame ground terminals 41, 42, 46, 47 are brought into contact with the terminal contact piece 25 even where the NUC board 40 is fixed to the terminal contact piece in an inclined manner. Thus, the NCU board 40 having a high reliability in comparison with a case where a singe frame ground terminal is formed on each of opposite sides of the boundary line 34.

Third Embodiment

Figure 8A:
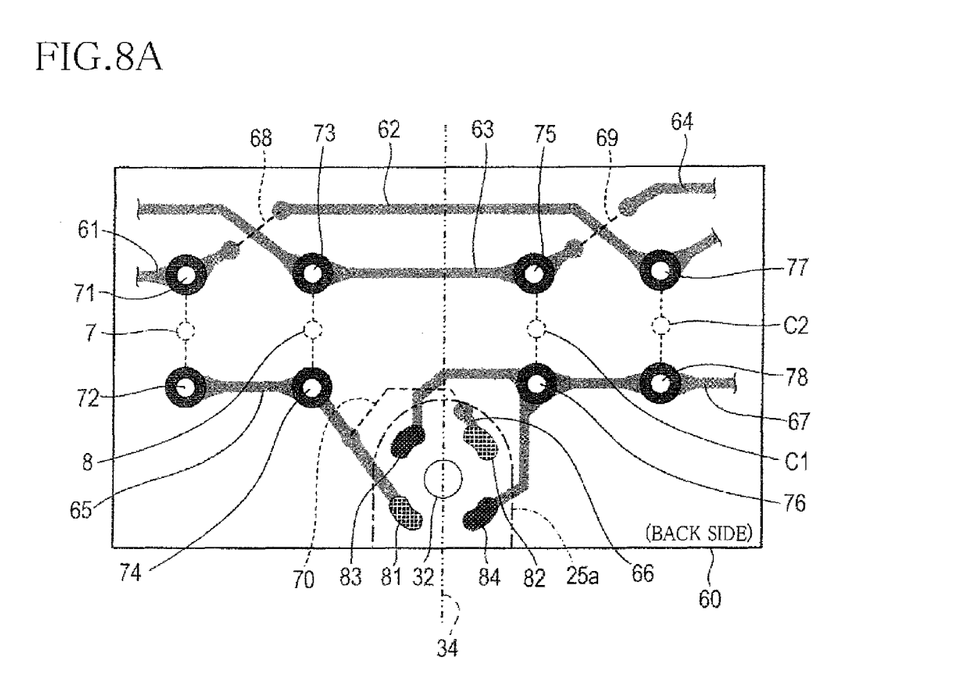
FIG. 8A is a plan view showing a back side of an NCU board in a third embodiment for explaining a position and a shape of each frame ground terminal.
Figure 8B:
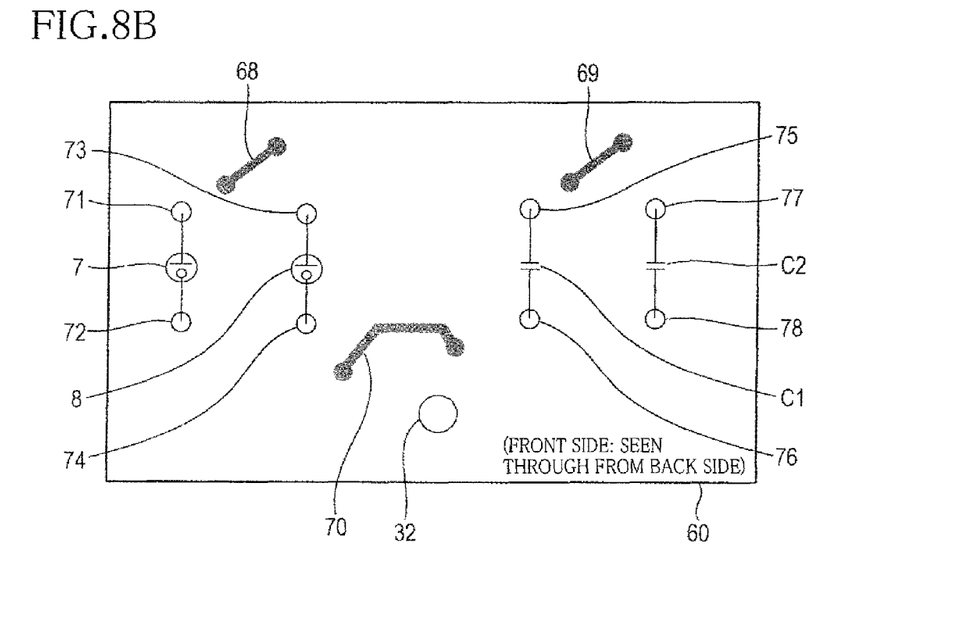
FIG. 8B is a plan view as a perspective view (i.e., a see-through view) showing a front side of the NCU board seen through from the back side thereof.

There will be next explained an NCU board in a third embodiment with reference to FIGS. 8A and 8B. On a back face of an NCU board 60 in this third embodiment shown in FIG. 8, there are formed a first transmission pattern 61 and a second transmission pattern 62 as the transmission line 5, and a third transmission pattern 63 and a fourth transmission pattern 64 as the transmission line 6. Further, on the back face of the NCU board 60, there are formed a first main frame ground pattern 65 and a first secondary frame ground pattern 66 to which the gas arrestors 7, 8 are connected, and a second frame ground pattern 67 to which the condensers C1, C2 are connected.

On a front face of the NCU board 60, there is formed a first intersecting connection pattern 68 for conduction of the first transmission pattern 61 and the second transmission pattern 62 formed on the back face. The first intersecting connection pattern 68 formed on the front face and the first transmission pattern 61 and the second transmission pattern 62 formed on the back face are held in conduction with one another by, e.g., vias formed in an inner layer of the NCU board 60. As a result, the first transmission pattern 61 and the second transmission pattern 62 are brought into conduction with each other via the first intersecting connection pattern 68 formed so as to intersect the third transmission pattern 63 while avoiding interference with the third transmission pattern 63.

Likewise, on the front face of the NCU board 60, there is formed a second intersecting connection pattern 69 for conduction of the third transmission pattern 63 and the fourth transmission pattern 64 formed on the back face. The third transmission pattern 63 and the fourth transmission pattern 64 are brought into conduction with each other via the second intersecting connection pattern 69 formed so as to intersect the second transmission pattern 62 while avoiding interference with the second transmission pattern 62.

Likewise, on the front face of the NCU board 60, there is formed a third intersecting connection pattern 70 for conduction of the first main frame ground pattern 65 and the first secondary frame ground pattern 66 formed on the back face. The first main frame ground pattern 65 and the first secondary frame ground pattern 66 are brought into conduction with each other via the third intersecting connection pattern 70 formed so as to intersect the second frame ground pattern 67 while avoiding interference with the second frame ground pattern 67.

Further, a through hole 71 is formed through the first transmission pattern 61. One of terminals of the gas arrestor 7 is inserted into the through hole 71. A through hole 77 is formed through the second transmission pattern 62. One of terminals of the condenser C2 is inserted into the through hole 77. Through holes 73, 75 are formed through the third transmission pattern 63. One of terminals of the gas arrestor 8 is inserted into the through hole 73, and one of terminals of the condenser C1 is inserted into the through hole 75. Through holes 72, 74 are formed through the first main frame ground pattern 65. The other of the terminals of the gas arrestor 7 is inserted into the through hole 72, and the other of the terminals of the gas arrestor 8 is inserted into the through hole 74.

Through holes 76, 78 are formed through the second frame ground pattern 67. The other of the terminals of the condenser C1 is inserted into the through hole 76, and the other of the terminals of the condenser C2 is inserted into the through hole 78.

It is noted that each of the gas arrestors 7, 8 and the condensers C1, C2 in the present embodiment is an insertion mounting component and is disposed on the front face of the NCU board 60. Each of the terminals of the gas arrestors 7, 8 and the condensers C1, C2 is inserted into a corresponding one of the through holes and soldered on the back face of the NCU board 60.

On a surrounding area of the board-side screw hole 32 into which the screw 31 is inserted, there are formed (a) two first frame ground terminals 81, 82 which are connected to the gas arrestors 7, 8 and (b) two second frame ground terminals 83, 84 which are connected to the condensers C1, C2, as frame ground terminals to be brought into contact and conduction with the terminal contact piece 25 of the frame 20.

That is, the first frame ground terminal 81 is formed on an end portion of the first main frame ground pattern 65, and the first frame ground terminal 82 is formed on an end portion of the first secondary frame ground pattern 66. The second frame ground terminal 83 is formed on one of two end parts of a distal end portion of the second frame ground pattern 67, the distal end portion being separated or bifurcated into the two end parts. The second frame ground terminal 84 is formed on the other of the two end parts of the distal end portion of the second frame ground pattern 67. It is noted that each of the first frame ground terminals 81, 82 in the present embodiment includes the first land and the first solder like those in the first embodiment. Further, each of the second frame ground terminals 83, 84 includes the second land and the second solder. When the NCU board 10 is fixed to the frame 20, the first solders of the respective first frame ground terminals 81, 82 and the second solders of the respective second frame ground terminals 83, 84 are brought into direct contact with the terminal contact piece 25, so that the first frame ground terminals 81, 82 and the second frame ground terminals 83, 84 are brought into conduction with the frame 20.

The frame ground terminals 81, 82, 83, 84 are formed so as to be symmetric about the boundary line 34 in their entirety. Further, each of the frame ground terminals 81, 82, 83, 84 is formed in the terminal-contact-piece facing area 25a and in an area other than the land unformable area 51 shown in FIG. 6. Further, the frame ground terminals 81, 82, 83, 84 are formed in the circumferential direction of the circle centered at the center of the board-side screw hole 32.

Thus, the four frame ground terminals 81, 82, 83, 84 in the present embodiment are formed in a manner similar to the frame ground terminals 41, 42, 46, 47 in the second embodiment except for their shapes in their entirety.

However, the four frame ground terminals 81, 82, 83, 84 in the present embodiment are different from the frame ground terminals 41, 42, 46, 47 in the following respect. That is, in the second embodiment, the two first frame ground terminals 41, 42 and the two second frame ground terminals 46, 47 are arranged on the respective opposite sides of the boundary line 34, but in the present embodiment, as apparent from FIG. 8A, the first frame ground terminals 81, 82 and the second frame ground terminals 83, 84 are alternately arranged one by one in the circumferential direction. That is, the first frame ground terminal 81, the second frame ground terminal 83, the first frame ground terminal 82, the second frame ground terminal 84 are arranged in that order in the circumferential direction.

Accordingly, similar effects achieved by the NCU board 40 in the second embodiment can be achieved by the NCU board

60 in the present embodiment. Specifically in the present embodiment, since the first frame ground terminals 81, 82 and the second frame ground terminals 83, 84 are alternately arranged in the circumferential direction, it is possible to reliably bring the frame ground terminals 81, 82, 83, 84 into contact and conduction with the frame 20 and in turn bring the frame ground patterns 65, 67 with the frame 20 even where the plate face of the terminal contact piece 25 is inclined with respect to the plate face of the NCU board 60.

Modifications

While the embodiments of the present invention have been described above, it is to be understood that the invention is not limited to the details of the illustrated embodiments, but may be embodied with various changes and modifications, which may occur to those skilled in the art, without departing from the spirit and scope of the invention.

For example, in the above-described embodiments, each of the number of the first frame ground terminals connected to the gas arrestors 7, 8 and the number the second frame ground terminals connected to the condensers C1, C2 is one (in the first embodiment) or two (in the second and third embodiments), but each of the numbers may be equal to or more than three. However, each of the numbers is preferably set at one or two. Further, the numbers do not have to be the same as each other.

Further, each of the frame ground terminals has the arc shape or the circular shape in the above-described embodiments, but this is merely one example. That is, each frame ground terminal may have a different shape. Further, forming the frame ground terminals so as to be symmetric about the boundary line 34, forming the frame ground terminals at the positions distant from the center of the board-side screw hole 32 by the predetermined distance, and forming the frame ground terminals along the circumferential direction of the circle centered at the center of the board-side screw hole 32 are examples of preferred conditions for reliably bringing each frame ground terminal into contact and conduction with the terminal contact piece 25, and these are not essential. As long as each frame ground terminal is reliably brought into contact and conduction with the terminal contact piece 25, a position, a shape, and so on of each frame ground terminal can be determined as appropriate.

Further, in the above-described embodiments, each frame ground terminal is formed by adhering the solder onto the corresponding land on the print circuit board, but the present invention is not limited to this configuration. For example, the land and the terminal contact piece 25 may be directly brought into contact with each other by omitting the adhesion and formation of the solder. Further, a conductor may be provided between the land and the terminal contact piece 25 such that the land and the terminal contact piece 25 are brought into contact with each other via the conductor.

Further, in the above-described embodiments, the NCU board 10 is fixed to the frame 20 by the insertion of the screw 31 into the board-side screw hole 32 and the frame-side screw hole 26, but the present invention is not limited to this configuration. For example, this communication apparatus 1 may employ a clamping mechanism configured to fix the NCU board to the frame by bringing the first and second frame ground terminals into contact with the terminal contact piece of the frame.

Further, in the above-described embodiments, the first and second frame ground terminals are provided on the lower face of the NCU board and brought into contact with the upper face of the terminal contact piece via the solder, but the present invention is not limited to this configuration. For example, the first and second frame ground terminals may be provided on the upper face of the NCU board and brought into contact with a lower face of the terminal contact piece via the solder.

Further, in the above-described embodiments, the NCU board and the frame are brought into conduction with each other by using the terminal contact piece, but the present invention is not limited to this configuration. For example, the NCU board and the frame may be brought into conduction with each other by bringing the NCU board into direct contact with the lower face of the frame and fixing the NCU board to the frame.

What is claimed is:

1. A communication apparatus comprising:
   a frame formed by a conductor;
   a transmission line connectable to a public line network and configured to transmit and receive a signal to and from the public line network in a state in which the transmission line is connected to the public line network;
   a print circuit board which includes a frame ground terminal portion electrically insulated from the transmission line and which is configured such that a dielectric strength between the transmission line and the frame ground terminal portion takes a specific value in a state in which a plurality of elements including a surge protection element are connected to between the transmission line and the frame ground terminal portion via a plurality of conductor patterns;
   wherein the frame ground terminal portion is brought into conduction with the frame by fixing of the print circuit board to the frame,
   wherein the frame ground terminal portion includes:
      at least one first land formed on an end portion of a first conductor pattern which is one of the plurality of conductor patterns formed on a face of the print circuit board, the surge protection element being connected to the first conductor pattern; and
      at least one second land electrically insulated from the at least one first land and formed on an end portion of a second conductor pattern which is another of the plurality of conductor patterns formed on the face of the print circuit board, at least one element of the plurality of elements other than the surge protection element being connected to the second conductor pattern, and
   wherein the frame and the print circuit board are configured such that the at least one first land and the at least one second land are brought into contact with the frame directly or via another conductor by fixing of the print circuit board to the frame.

2. The communication apparatus according to claim 1, further comprising a fastening mechanism for fastening the frame to the print circuit board,
   wherein the print circuit board is configured to be fixed to the frame by the fastening mechanism.

3. The communication apparatus according to claim 1,
   wherein each of the frame and the print circuit board has an cylindrical insertion hole through which a fastening member for fastening the frame to the print circuit board is inserted, and
   wherein the print circuit board is configured to be fixed to the frame by being fastened to the frame by the fastening member.

4. The communication apparatus according to claim 3,
   wherein the at least one first land and the at least one second land are formed at positions each distant from equal to or greater than a predetermined distance from a center of the insertion hole formed in the print circuit board.

5. The communication apparatus according to claim 3, wherein the at least one first land is formed on one of two areas on the face of the print circuit board, a boundary of the two areas being a straight line which passes through the center of the insertion hole and which is parallel to the print circuit board, and
wherein the at least one second land is formed on the other of the two areas on the print circuit board.

6. The communication apparatus according to claim 5, wherein the frame includes (a) a frame main body portion formed by bending a conductor having a plate shape and (b) a terminal contact piece portion formed so as to be bent and projected from an edge of the frame main body portion,
wherein the terminal contact piece portion is configured such that the at least one first land and the at least one second land are brought into contact with the terminal contact piece portion directly or via said other conductor when the print circuit board is fixed to the frame, and
wherein the straight line is parallel to a direction in which the terminal contact piece portion is projected from the edge of the frame main body portion.

7. The communication apparatus according to claim 6, wherein each of the number of the at least one first land and the number of the at least one second land is one or two.

8. The communication apparatus according to claim 7, wherein each of the number of the at least one first land and the number of the at least one second land is one, and
wherein each of the first land and the second land has an arc shape centered at the center of the insertion hole.

9. The communication apparatus according to claim 7, wherein each of the number of the at least one first land and the number of the at least one second land is two, and
wherein each set of the two first lands and the two second lands are disposed along the circumferential direction about the center of the insertion hole and along a direction parallel to the straight line.

10. The communication apparatus according to claim 6, wherein the at least one first land and the at least one second land are formed in a facing area on the face of the print circuit board which facing area faces the terminal contact piece portion when the print circuit board is fixed to the frame.

11. The communication apparatus according to claim 6, wherein a solder is attached to and formed on each of the at least one first land and the at least one second land, and
wherein the at least one first land and the at least one second land are configured to be brought into conduction with the frame via the respective solders on the at least one first land and the at least one second land by direct contact of the respective solders on the at least one first land and the at least one second land with the terminal contact piece portion.

12. The communication apparatus according to claim 6, wherein the frame main body portion is formed by bending the conductor such that an upper side of the frame main body portion in a vertical direction is made open,
wherein the at least one first land and the at least one second land are provided on a lower face of the print circuit board, and
wherein the frame and the print circuit board are configured such that the at least one first land and the at least one second land are brought into contact with the terminal contact piece portion directly or via said other conductor by fixing of the print circuit board to an upper face of the terminal contact piece portion from an upper side of the frame.

13. The communication apparatus according to claim 5, wherein the at least one first land and the at least one second land are formed so as to be symmetric in position with each other with respect to the straight line.

14. The communication apparatus according to claim 3, wherein each of the at least one first land and each of the at least one second land are disposed along a circumferential direction of a circle centered at the center of the insertion hole.

15. The communication apparatus according to claim 3, wherein the at least one first land is a plurality of first lands, and the at least one second land is a plurality of second lands, and
wherein each of the plurality of first lands and each of the plurality of second lands are disposed along a circumferential direction of a circle centered at the center of the insertion hole.

16. The communication apparatus according to claim 15, wherein each of the plurality of first lands and each of the plurality of second lands are arranged alternately by one or more than one along the circumferential direction.

17. The communication apparatus according to claim 16, wherein each of the number of the plurality of first lands and the number of the plurality of second lands is two, and
wherein each of the plurality of first lands and each of the plurality of second lands are arranged alternately by one along the circumferential direction.

18. The communication apparatus according to claim 1, wherein a solder is attached to and formed on each of the at least one first land and the at least one second land, and
wherein the at least one first land and the at least one second land are configured to be brought into conduction with the frame via the respective solders on the at least one first land and the at least one second land by direct contact of the respective solders on the at least one first land and the at least one second land with the frame.

19. A withstand voltage test method for the communication apparatus described in claim 1, comprising:
applying a voltage of a predetermined value to between the transmission line and the at least one second land in a state in which the at least one first land and the at least one second land are insulated from each other; and
measuring an electric property between the transmission line and the at least one second land during the application of the voltage.

* * * * *